(12) United States Patent
Kudoh et al.

(10) Patent No.: US 11,987,686 B2
(45) Date of Patent: May 21, 2024

(54) THERMALLY CONDUCTIVE SHEET (71) Applicant: SEKISUI POLYMATECH CO., LTD., Saitama (JP)

(72) Inventors: Hiroki Kudoh, Kawaguchi (JP); Taku Sasaki, San Jose, CA (US); Kana Hattori, Nishinomiya (JP); Kazuyuki Yahara, Nagaokakyo (JP); Yasunari Kusaka, Osaka (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 639 days.

(21) Appl. No.: 17/252,957

(22) PCT Filed: Jun. 18, 2019

(86) PCT No.: PCT/JP2019/024113
§ 371 (c)(1),
(2) Date: Dec. 16, 2020

(87) PCT Pub. No.: WO2019/244890
PCT Pub. Date: Dec. 26, 2019

(65) Prior Publication Data
US 2021/0130570 A1  May 6, 2021

(30) Foreign Application Priority Data

Jun. 22, 2018 (JP) .................... 2018-119378

(51) Int. Cl.
*C08K 3/04* (2006.01)
*C08L 83/04* (2006.01)
(Continued)

(52) U.S. Cl.
CPC ............... *C08K 3/04* (2013.01); *C08L 83/04* (2013.01); *C08K 2003/2227* (2013.01);
(Continued)

(58) Field of Classification Search
None
See application file for complete search history.

(56) References Cited

U.S. PATENT DOCUMENTS

| 11,618,247 B2 | 4/2023 | Kudoh et al. |
| 2006/0234056 A1 | 10/2006 | Huang et al. |

(Continued)

FOREIGN PATENT DOCUMENTS

| CN | 101087511 | 12/2007 |
| CN | 101309576 | 11/2008 |

(Continued)

OTHER PUBLICATIONS

Machine translation of JP2018056315-A (Year: 2023).*
(Continued)

*Primary Examiner* — Alexander S Thomas
(74) *Attorney, Agent, or Firm* — WENDEROTH, LIND & PONACK, L.L.P.

(57) ABSTRACT

A thermally conductive sheet 10 comprises a polymer matrix 12 and an anisotropic filler 13, and the anisotropic filler 13 is oriented in a thickness direction. The anisotropic filler 13 is exposed on the surfaces 10A, 10B of the thermally conductive sheet 10, and the anisotropic filler 13 which is exposed is disposed in such a way as to fall down in a proportion of 3.5 to 45%.

11 Claims, 4 Drawing Sheets (51) Int. Cl.
 *C08K 3/22* (2006.01)
 *C08K 7/04* (2006.01)
 *C08K 7/18* (2006.01)
(52) U.S. Cl.
 CPC .................. *C08K 7/04* (2013.01); *C08K 7/18* (2013.01); *C08K 2201/001* (2013.01); *C08K 2201/003* (2013.01); *C08K 2201/004* (2013.01)

(56) References Cited

U.S. PATENT DOCUMENTS

| | | |
|---|---|---|
| 2007/0284366 A1 | 12/2007 | Ohta |
| 2017/0336535 A1 | 11/2017 | Shima et al. |
| 2018/0186037 A1 | 7/2018 | Goshima et al. |
| 2020/0243414 A1 | 7/2020 | Kudoh |
| 2021/0130570 A1 | 5/2021 | Kudoh et al. |
| 2022/0289932 A1 | 9/2022 | Kudoh et al. |

FOREIGN PATENT DOCUMENTS

| | | | | |
|---|---|---|---|---|
| CN | 108407425 | 8/2018 | | |
| JP | 2001-156227 | 6/2001 | | |
| JP | 2006-335958 | 12/2006 | | |
| JP | 2007-326976 | 12/2007 | | |
| JP | 2008-251747 | 10/2008 | | |
| JP | 2010-254766 | 11/2010 | | |
| JP | 2011-241403 | 12/2011 | | |
| JP | 2014-27144 | 2/2014 | | |
| JP | 2015-73067 | 4/2015 | | |
| JP | 2016-506 | 1/2016 | | |
| JP | 2017-27144 | 2/2017 | | |
| JP | 6178389 | 7/2017 | | |
| JP | 2017-135137 | 8/2017 | | |
| JP | 2018-14534 | 1/2018 | | |
| JP | 2018-56315 | 4/2018 | | |
| JP | 2018056315 A | * | 4/2018 | ............ B32B 27/20 |
| TW | 201830615 | 8/2018 | | |
| WO | 2016/208458 | 12/2016 | | |
| WO | 2016/208509 | 12/2016 | | |
| WO | 2017/018232 | 2/2017 | | |
| WO | 2017/179318 | 10/2017 | | |
| WO | 2017/179416 | 10/2017 | | |

OTHER PUBLICATIONS

International Search Report (ISR) dated Aug. 27, 2019 in International (PCT) Application No. PCT/JP2019/024113.
Extended European Search Report dated Feb. 18, 2022 in European Patent Application No. 19823508.7.
International Search Report issued Dec. 17, 2019 in International (PCT) Application No. PCT/JP2019/037554.
English Machine Translation of JP 2018-014534 (Year: 2018).
Non-Final Office Action issued Nov. 7, 2023 in U.S. Appl. No. 17/278,420.

* cited by examiner

THERMALLY CONDUCTIVE SHEET

TECHNICAL FIELD

The present invention relates to a thermally conductive sheet, and relates to, for example, a thermally conductive sheet to be used by being disposed between a heat-generating element and a heat-dissipating element.

BACKGROUND ART

In electronic devices, such as a computer, an automobile part, and a cellular phone, a heat-dissipating element, such as a heat sink, is generally used for dissipating heat which is generated from a heat-generating element such as a semiconductor element or a mechanical part. It is known that a thermally conductive sheet is disposed between a heat-generating element and a heat-dissipating element for the purpose of enhancing the efficiency of heat transfer to the heat-dissipating element.

A thermally conductive sheet is generally used by being compressed when disposed inside an electronic device, and high flexibility is required in the thermally conductive sheet. Accordingly, a thermally conductive sheet is formed by blending a filler having thermal conductive properties in a polymer matrix having high flexibility, such as rubber or gel. Further, it is widely known that a filler having anisotropy, such as a carbon fiber, is oriented in the thickness direction in a thermally conductive sheet in order to enhance the thermal conductive properties in the thickness direction (see, for example, PTLs 1 and 2).

CITATION LIST

Patent Literature

PTL1: JP 2018-056315 A
PTL2: JP 2018-014534 A

SUMMARY OF INVENTION

Technical Problem

With sophisticated function of electric devices, needs for enhancing the properties of a thermally conductive sheet have also been increased and further enhancement of the thermal conductivity in the thickness direction has been desired in recent years. However, as disclosed in PTLs 1 and 2, there is limitation on enhancing the thermal conductivity only by orienting a filler in the thickness direction, and further improvements have been desired.

The present invention has been completed in view of the above problems, and an object of the present invention is to provide a thermally conductive sheet capable of sufficiently improving the thermal conductive properties in the thickness direction.

Solution to Problem

The present inventors have conducted diligent studies to find that by disposing an anisotropic filler exposed on a surface, in such a way as to fall down in a predetermined proportion, the problems can be solved, and thereby completed the present invention. The present invention provides the following [1] to [11].

[1] A thermally conductive sheet comprising:
a polymer matrix; and
an anisotropic filler, the anisotropic filler oriented in a thickness direction,
the anisotropic filler being exposed on a surface of the thermally conductive sheet, and the anisotropic filler which being exposed is disposed in such a way as to fall down in a proportion of 3.5 to 45%.
[2] The thermally conductive sheet according to [1], wherein the anisotropic filler is a fiber material.
[3] The thermally conductive sheet according to [2], wherein the fiber material is a carbon fiber.
[4] The thermally conductive sheet according to [2] or [3], wherein the fiber material has an average fiber length of 50 to 500 μm.
[5] The thermally conductive sheet according to any one of [1] to [4], further comprising a non-anisotropic filler.
[6] The thermally conductive sheet according to [5], wherein the non-anisotropic filler is at least one selected from the group consisting of alumina, aluminum, zinc oxide, boron nitride, and aluminum nitride.
[7] The thermally conductive sheet according to [5] or [6], wherein a ratio of a volume filling ratio of the non-anisotropic filler to a volume filling ratio of the anisotropic filler is 2 to 5.
[8] The thermally conductive sheet according to any one of [1] to [7], wherein at least part of the anisotropic filler which is disposed in such a way as to fall down on the surface is disposed in such a way as to incline with respect to the surface.
[9] The thermally conductive sheet according to any one of [1] to [8], wherein the polymer matrix is addition reaction-curable type silicone.
[10] The thermally conductive sheet according to any one of [1] to [9], wherein the thermally conductive sheet has a thickness of 0.1 to 5 mm.
[11] The thermally conductive sheet according to any one of [1] to [10], wherein the thermally conductive sheet has a thermal conductivity in a thickness direction of 10 w/m·K or more.

Advantageous Effects of Invention

According to the present invention, a thermally conductive sheet capable of sufficiently improving the thermal conductive properties in the thickness direction can be provided.

DESCRIPTION OF EMBODIMENTS

Hereinafter, a thermally conductive sheet according to embodiments of the present invention will be described in detail.

First Embodiment

Figure 1:
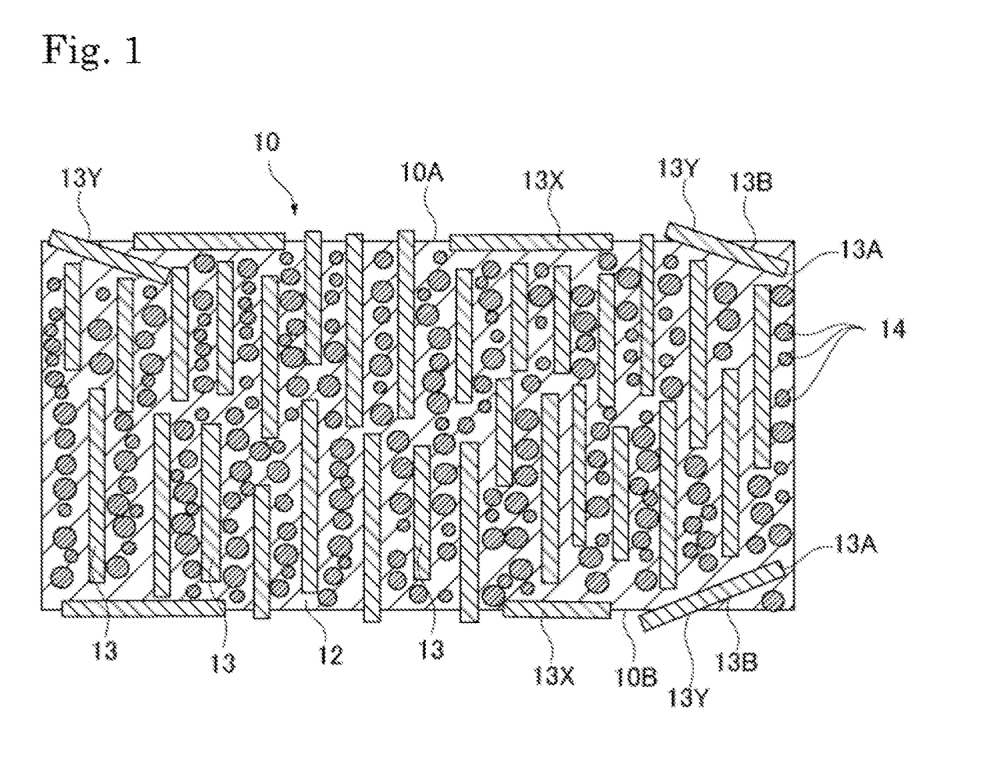
FIG. 1 is a schematic section view showing a thermally conductive sheet of the first embodiment.

FIG. 1 shows a thermally conductive sheet of the first embodiment. In FIG. 1, an example of a case where an anisotropic filler is a fiber material is representatively shown. The thermally conductive sheet 10 according to the first embodiment comprises a polymer matrix 12 and an anisotropic filler 13, and the anisotropic filler 13 is oriented in the thickness direction. The anisotropic filler 13 is exposed on each surface 10A, 10B of the thermally conductive sheet 10, and part of the anisotropic filler 13 which is exposed is disposed in such a way as to fall down.

In the present embodiment, the anisotropic filler 13 is exposed, and part of the anisotropic filler 13 is disposed in such a way as to fall down, thereby making the contact area with an object of contact, such as a heat-dissipating element or a heat-generating element which the thermally conductive sheet 10 is in contact with, large, and therefore the thermal conductivity between the surfaces 10A, 10B can be improved. Further, the anisotropic filler 13 disposed in such a way as to fall down makes it easy to form thermally conductive paths by being in contact with the anisotropic filler 13 which is oriented in the thickness direction near the surfaces 10A, 10B, thereby also making it easy to enhance the thermal conductivity in the thickness direction.

The anisotropic filler 13 exposed on each surface 10A, 10B is disposed in such a way as to fall down in a proportion of 3.5 to 45%. When the proportion of the anisotropic filler which is disposed in such a way as to fall down is less than 3.5%, the exposed area of the anisotropic filler 13 on the surface cannot be made sufficiently large, and further, the anisotropic filler 13 which is disposed in such a way as to fall down is made unlikely to be in contact with the anisotropic filler 13 which is oriented in the thickness direction, so that the thermal conductivity in the thickness direction cannot be improved sufficiently. When the proportion of the anisotropic filler which is disposed in such a way as to fall down exceeds 45%, the amount of the anisotropic filler which is oriented in the thickness direction near the surface is made small, so that there is a possibility that it is made difficult to improve the thermal conductivity in the thickness direction. In addition, rougher sandpaper needs to be used in order to make many anisotropic fillers 13 fall down and therefore damages the surface of a sheet, making it difficult to use the sheet practically.

The proportion of the anisotropic filler which is disposed in such a way as to fall down is preferably 10% or more, more preferably 15% or more, and still more preferably 18% or more from the viewpoint of enhancing the thermal conductivity in the thickness direction. The proportion is preferably 40% or less, more preferably 30% or less, and still more preferably 25% or less from the viewpoint of preventing damage and the like on the surface of the sheet.

The proportion of the anisotropic filler which is disposed in such a way as to fall down at the surface can be calculated by determining the proportion of the number of the anisotropic fillers disposed in such a way as to fall down to the total number of the anisotropic fillers exposed on the surface in an observation image photographed with a scanning electron microscope.

The anisotropic filler 13 disposed in such a way as to fall down herein is a filler fallen down in such an extent that a portion other than an end surface 13A of the anisotropic filler 13 is substantially observed in the observation image. The extent of being substantially observed means that the portion other than the end surface 13A of each anisotropic filler 13 is observed in an area (projected area) twice that of the end surface 13A or more. Accordingly, when the anisotropic filler 13 is a fiber material, a fiber material with an outer peripheral surface 13B of the fiber material having an area twice that of the end surface 13A of the fiber material or more in an observation image is regarded as the anisotropic filler disposed in such a way as to fall down.

With respect to an image-analyzing method, the observation image may be observed visually. In addition, the analysis method is not limited as long as the proportion of the number of the anisotropic fillers disposed in such a way as to fall down can be calculated by the above-described standard, and calculation may be conducted using image processing software.

The anisotropic filler 13 disposed in such a way as to fall down on each surface 10A, 10B may be disposed in such a way as to lie down on each surface 10A, 10B of the thermally conductive sheet, or may be disposed in such a way as to incline with respect to each surface 10A, 10B. In addition, the anisotropic filler 13 disposed in such a way as to fall down preferably has an inclination angle with respect to the thickness direction of about 45 to about 90°. When the inclination angle made with respect to the thickness direction exceeds 90°, the supplementary angle is defined as the inclination angle.

The anisotropic filler 13 which is disposed in such a way as to lie down on the surface of the thermally conductive sheet is an anisotropic filler which is substantially disposed along the surface 10A (or 10B). Such an anisotropic filler is shown as an anisotropic filler 13X in FIG. 1.

In addition, the anisotropic filler which inclines with respect to the surface is an anisotropic filler which inclines to such an extent that the anisotropic filler is buried in the polymer matrix 12 in such a way that one end surface 13A of the anisotropic filler 13 separates from the surface 10A (or 10B). Such an anisotropic filler is shown as an anisotropic filler 13Y in FIG. 1.

The anisotropic filler 13 disposed in such a way as to fall down on each surface 10A, 10B preferably comprises the anisotropic filler 13Y which is disposed in such a way as to incline with respect to the surface. The anisotropic filler 13Y which is disposed in such a way as to incline easily comes into contact with the anisotropic filler 13 which is oriented in the thickness direction, making it easy to improve the thermal conductive properties in the thickness direction.

The end surface 13A or the like of the anisotropic filler 13 which is exposed may be polished by being polished in, for example, the polishing step which will be mentioned later. In addition, the anisotropic filler 13 which is exposed on the surfaces 10A, 10B may be disposed in such a way that at least part of it protrudes from the surfaces 10A, 10B.

In the present embodiment, the thermally conductive sheet 10 further comprises a non-anisotropic filler 14. The thermally conductive sheet 10, when further comprising the non-anisotropic filler 14, makes the thermal conductive properties further better.

<Polymer Matrix>

The polymer matrix 12 which is used in the thermally conductive sheet 10 is a polymer compound, such as an elastomer or a rubber, and a product formed by curing a polymer composition (curable polymer composition) in a liquid form, the polymer composition comprising a mixed system such as the one comprising a main agent and a curing agent, may preferably be used. For example, the curable polymer composition may be a composition comprising an uncrosslinked rubber and a crosslinking agent, or a composition comprising: a monomer, a prepolymer, or the like; and a curing agent or the like. The curing reaction may be cold curing or heat curing.

Examples of the polymer matrix which is formed from the curable polymer composition include silicone rubber. In the case of silicone rubber, addition reaction-curable type silicone is preferably used as the polymer matrix (curable polymer composition). More specifically, a curable polymer composition comprising alkenyl group-containing organopolysiloxane and hydrogen organopolysiloxane may be used as the curable polymer composition.

Various synthetic rubbers other than the above-described rubber can be used as the rubber, and specific examples thereof include acrylic rubber, nitrile rubber, isoprene rubber, urethane rubber, ethylene propylene rubber, styrene/butadiene rubber, butadiene rubber, fluororubber, and butyl rubber. When any of these rubbers is used, the synthetic rubber may be crosslinked or left uncrosslinked (that is, uncured) in the thermally conductive sheet. Uncrosslinked rubber is used mainly in flow orientation.

When the synthetic rubber is crosslinked (that is, cured), the polymer matrix may be, as described above, a product obtained by curing a curable polymer composition comprising: an uncrosslinked rubber comprising any of these synthetic rubbers; and a crosslinking agent.

As the elastomer, a thermoplastic elastomer, such as a polyester-based thermoplastic elastomer or a polyurethane-based thermoplastic elastomer, or a heat-curable type elastomer which is formed by curing a polymer composition in a liquid form of a mixed system comprising a main agent and a curing agent can be used. Examples of the elastomer include a polyurethane-based elastomer which is formed by curing a polymer composition comprising: a polymer having a hydroxy group; and isocyanate.

Among those described above, silicone rubber, or particularly addition reaction-curable type silicone is preferably used from the viewpoint that, for example, the polymer matrix after curing is particularly flexible and filling properties of a thermally conductive filler are good.

The polymer composition for forming the polymer matrix may be a polymer composition comprising a single substance of a polymer compound, or may be a polymer composition comprising a polymer compound and a plasticizer. The plasticizer is suitably used when a synthetic rubber is used, and when the plasticizer is contained, the flexibility of the uncrosslinked polymer matrix can thereby be enhanced.

The plasticizer having compatibility with the polymer compound is used, and specifically, the plasticizer is preferably an ester-based plasticizer or silicone oil. Specific examples of the ester-based plasticizer include a phthalic acid ester, an adipic acid ester, a trimellitic acid ester, a phosphoric acid ester, a sebacic acid ester, an azelaic acid ester, a maleic acid ester, and a benzoic acid ester. Examples of the silicone oil include polydimethylsiloxane.

The content of the plasticizer to the polymer compound is preferably 20/80 to 60/40, and more preferably 30/70 to 55/45 in terms of a mass ratio of plasticizer/polymer compound. Setting the mass ratio of plasticizer/polymer compound to 60/40 or less makes it easy to retain the filler by the polymer compound. Setting the mass ratio to 20/80 or more makes the flexibility of the polymer matrix sufficient. The plasticizer is suitably used when the anisotropic filler is oriented by the flow orientation which will be mentioned later.

The content of the polymer matrix, when expressed by a filling ratio on a volume basis (volume filling ratio), is preferably 20 to 50% by volume, and more preferably 25 to 45% by volume based on the total amount of the thermally conductive sheet.

(Additive)

In the thermally conductive sheet 10, various additives may further be blended in the polymer matrix 12 in a range where the function as the thermally conductive sheet 10 is not impaired. Examples of the additive include at least one or more selected from a dispersant, a coupling agent, a pressure-sensitive adhesive, a fire retardant, an antioxidant, a coloring agent, an anti-settling agent, and the like. When the curable polymer composition is subjected to crosslinking, curing, or the like, as described above, a crosslinking accelerator, a curing accelerator, or the like that accelerates crosslinking or curing may be blended as an additive.

<Anisotropic Filler>

The anisotropic filler 13 which is blended in the polymer matrix 12 is a filler having anisotropy in the shape and is a filler that can be oriented. The anisotropic filler 13 is a heat-conducting filler. Examples of the anisotropic filler 13 include a fiber material and a flake-like material. The anisotropic filler 13 is a filler having a high aspect ratio and is specifically a filler having an aspect ratio of exceeding 2, and the aspect ratio is preferably 5 or more. Setting the aspect ratio to larger than 2 makes it easy to orient the anisotropic filler 13 in the thickness direction, so that the thermal conductive properties of the thermally conductive sheet 10 are enhanced easily.

The upper limit of the aspect ratio is not particularly limited, but is 100 in practical use.

The aspect ratio refers to a ratio of the length in the major axis direction to the length in the minor axis direction of the anisotropic filler 13, and means fiber length/diameter of fiber in a fiber material, and length in major axis direction of flake-like material/thickness in a flake-like material.

The anisotropic filler 13 is preferably a fiber material from the viewpoint of enhancing the thermal conductive properties and from the viewpoint of easily disposing the anisotropic filler 13 in such a way as to fall down on the surfaces 10A, 10B.

The content of the anisotropic filler 13 in the thermally conductive sheet is preferably 30 to 300 parts by mass, and more preferably 50 to 270 parts by mass based on 100 parts by mass of the polymer matrix. The content of the anisotropic filler 13, when expressed by a filling ratio on a volume basis (volume filling ratio), is preferably 5 to 35% by volume, and more preferably 8 to 30% by volume based on the total amount of the thermally conductive sheet.

Setting the content of the anisotropic filler 13 to 30 parts by mass or more makes it easy to enhance the thermal conductive properties, and setting the content to 300 parts by mass or less easily makes the viscosity of the mixed composition, which will be mentioned later, proper, thereby making the orientation of the anisotropic filler 13 good.

When the anisotropic filler 13 is a fiber material, the average fiber length is preferably 50 to 500 μm, and more preferably 70 to 350 μm. When the average fiber length is set to 50 μm or more, the anisotropic fillers come into contact properly inside the thermally conductive sheet 10, so that heat transmission paths are secured. In addition, the anisotropic filler 13 is easily disposed in such a way as to fall down at the surface of the thermally conductive sheet 10, making the thermal conductive properties of the thermally conductive sheet 10 good.

On the other hand, when the average fiber length is set to 500 μm or less, the bulk of the anisotropic filler is made low, so that the anisotropic filler can be made highly filled in the polymer matrix.

The above-described average fiber length can be calculated by observing the anisotropic filler with a microscope. More specifically, the fiber lengths of arbitrary 50 anisotropic fillers are measured using, for example, an electron microscope or an optical microscope, and the average value (arithmetical mean value) can be adopted as the average fiber length.

The average fiber length of the fiber material is preferably shorter than the thickness of the thermally conductive sheet 10. When the average fiber length is shorter than the thickness, the fiber material is thereby prevented from protruding from the surfaces 10A, 10B of the thermally conductive sheet 10 more than necessary.

When the anisotropic filler 13 is a flake-like material, the average particle diameter is preferably 10 to 400 µm, and more preferably 15 to 200 µm. The average particle diameter is particularly preferably 15 to 130 µm. Setting the average particle diameter to 10 µm or more makes it easy for the anisotropic fillers 13 to come into contact in the thermally conductive sheet 10, so that heat transmission paths are secured. In addition, the anisotropic filler 13 is easily disposed in such a way as to fall down on the surface of the thermally conductive sheet 10, making the thermal conductive properties of the thermally conductive sheet 10 good. On the other hand, when the average particle diameter is set to 400 µm or less, the bulk of the thermally conductive sheet 10 is made low, enabling the anisotropic filler 13 to be highly filled in the polymer matrix 12.

The average particle diameter of the flake-like material can be calculated by observing the anisotropic filler with a microscope and assuming the major axis as the diameter. More specifically, the major axes of arbitrary 50 anisotropic fillers are measured using, for example, an electron microscope or an optical microscope, and the average value (arithmetical mean value) can be adopted as the average particle diameter.

A known material having thermal conductive properties may be used as the anisotropic filler 13, but as will be mentioned later, the anisotropic filler 13 preferably has diamagnetism in such a way that the anisotropic filler can be oriented by a magnetic field.

Specific examples of the anisotropic filler 13 include a carbon-based material represented by a carbon fiber or a flake-like carbon powder, a metal material represented by a metal fiber, a metal oxide, boron nitride, a metal nitride, a metal carbide, and a metal hydroxide. A carbon-based material among these has a small specific gravity and good dispersibility into the polymer matrix 12 and is therefore preferable, and, among others, the anisotropic filler is more preferably a graphitized carbon material having a high thermal conductivity. A graphitized carbon material, when having graphite planes uniformly facing a predetermined direction, has diamagnetism. In addition, boron nitride or the like, when having crystal planes uniformly facing in a predetermined direction, also has diamagnetism. Further, the anisotropic filler 13 is particularly preferably a carbon fiber.

The anisotropic filler 13 has a thermal conductivity of, though not limited to, generally 60 W/m·K or more, and preferably 400 W/m·K or more along a direction of having anisotropy (that is, major axis direction). The anisotropic filler 13 has a thermal conductivity of, for example, 2000 W/m·K or less although the upper limit is not particularly limited. The method of measuring the thermal conductivity is a laser flash method.

The anisotropic filler 13 may be used singly, or two or more anisotropic fillers 13 may be used together. For example, at least two anisotropic fillers 13 each having a different average particle diameter or average fiber length may be used as the anisotropic filler 13. It is considered that when the anisotropic fillers each having a different size are used, a smaller anisotropic filler gets in between relatively larger anisotropic fillers, and thereby the anisotropic fillers can be filled up to high density in the polymer matrix and heat-conducting efficiency can be enhanced.

The carbon fiber which is used as the anisotropic filler 13 is preferably a graphitized carbon fiber. The flake-like carbon powder is preferably a flake-like graphite powder. Among these, the anisotropic filler 13 is more preferably a graphitized carbon fiber.

A graphitized carbon fiber has a high thermal conductivity in its fiber axis direction because crystal planes of graphite run in the fiber axis direction. Therefore, by allowing fiber axis directions of the graphitized carbon fiber to face uniformly in a predetermined direction, the thermal conductivity in a particular direction can be enhanced. The flake-like graphite powder has a high thermal conductivity in its in-plane direction because crystal planes of graphite run in the in-plane direction of the flake plane. Therefore, by allowing flake planes of the flake-like graphite powder to face uniformly in a predetermined direction, the thermal conductivity in a particular direction can be enhanced. The graphitized carbon fiber and the flake-like graphite powder each having a high degree of graphitization are preferable.

As the above-described graphitized carbon materials, such as the graphitized carbon fiber and the flake-like graphite powder, products obtained by graphitizing the following raw materials can be used. Examples thereof include a condensed polycyclic hydrocarbon compound, such as naphthalene, and a condensed heterocyclic compound, such as PAN (polyacrylonitrile) or pitch, and graphitized mesophase pitch having a high degree of graphitization, polyimide, or polybenzazole in particular is preferably used. For example, by using mesophase pitch, the pitch is oriented in the fiber axis direction due to its anisotropy in the spinning step which will be mentioned later, so that a graphitized carbon fiber having excellent thermal conductive properties in the fiber axis direction can be obtained.

The aspect of using the mesophase pitch in the graphitized carbon fiber is not particularly limited as long as spinning can be conducted, and the mesophase pitch may be used singly, or may be used in combination with another raw material. However, the mesophase pitch is most preferably used singly, that is a graphitized carbon fiber having a content of mesophase pitch of 100% is most preferable from the viewpoint of enhancement in thermal conductive properties; spinnability; and stability in product quality.

The graphitized carbon fiber obtained such that treatments of spinning, infusibilization, and carbonization are conducted in sequence, and pulverization or cutting is conducted to a predetermined particle diameter, and thereafter graphitization is conducted, or the graphitized carbon fiber such that carbonization is conducted, pulverization or cutting is then conducted, and thereafter graphitization is conducted can be used. When pulverization or cutting is conducted before graphitization, a condensation polymerization and a cyclization reaction progress easily on a surface newly exposed due to pulverization during the graphitization treatment, and therefore a graphitized carbon fiber having thermal conductive properties further improved by enhancing the degree of graphitization can be obtained. When, on the other hand, pulverization is conducted after graphitizing a spun carbon fiber, the carbon fiber after graphitization is rigid and therefore is easily pulverized, so that a carbon fiber powder having a relatively narrow fiber length distribution can be obtained by brief pulverization.

The average fiber length of the graphitized carbon fiber is preferably 50 to 500 µm, and more preferably 70 to 350 µm, as described above. The aspect ratio of the graphitized carbon fiber exceeds 2, and more preferably 5 or more, as described above. The thermal conductivity of the graphitized carbon fiber is not particularly limited, but the thermal conductivity in the fiber axis direction is preferably 400 W/m·K or more, and more preferably 800 W/m·K or more.

The anisotropic filler 13 is oriented in the thickness direction as described above, but the major axis direction does not necessarily need to be strictly parallel to the thickness direction, and if the major axis direction inclines somewhat in the thickness direction, the anisotropic filler is assumed to be oriented in the thickness direction. Specifically, an anisotropic filler whose major axis direction inclines by about less than 20° is assumed to be the anisotropic filler 13 which is oriented in the thickness direction, and when such an anisotropic filler 13 is the majority (for example, exceeding 60%, and preferably exceeding 80% based on the total number of anisotropic fillers) in the thermally conductive sheet 10, the anisotropic filler is oriented in the thickness direction.

<Non-Anisotropic Filler>

The non-anisotropic filler 14 is a thermally conductive filler contained in the thermally conductive sheet 10 separately from the anisotropic filler 13 and is a material which, together with the anisotropic filler 13, imparts thermal conductive properties to the thermally conductive sheet 10. In the present embodiment, by filling the non-anisotropic filler 14, an increase in the viscosity is suppressed, making the dispersibility good in the stage prior to curing into a sheet. In addition, in the anisotropic fillers 13, when, for example, the fiber length is large, it is difficult to increase the contact area between the fillers, but when the non-anisotropic filler 14 fills the space between the anisotropic fillers, heat transfer paths can thereby be formed, so that the thermally conductive sheet 10 having a high thermal conductivity is obtained.

The non-anisotropic filler 14 is a filler whose shape is substantially free of anisotropy, and is a filler such that even in an environment where the anisotropic filler 13 is oriented in a predetermined direction, such as an environment, which will be mentioned later, where lines of magnetic force are generated or shear force is applied, the non-anisotropic filler 14 is not oriented in the predetermined direction.

The non-anisotropic filler 14 has an aspect ratio of 2 or less, and preferably 1.5 or less. In the present embodiment, when the non-anisotropic filler 14 having such a low aspect ratio is contained, the filler having thermal conductive properties is thereby properly interposed in the space between the anisotropic fillers 13, so that the thermally conductive sheet 10 having a high thermal conductivity is obtained. In addition, by setting the aspect ratio to 2 or less, an increase in the viscosity of the mixed composition which will be mentioned later is prevented, enabling the thermally conductive sheet to be highly filled.

Specific examples of the non-anisotropic filler 14 include a metal, a metal oxide, a metal nitride, a metal hydroxide, a carbon material, and an oxide, a nitride, and a carbide other than the metal oxide, the metal nitride, and a metal carbide. Examples of the shape of the non-anisotropic filler 14 include a spherical shape and an indefinite-form powder.

In the non-anisotropic filler 14, examples of the metal include aluminum, copper, and nickel, examples of the metal oxide include aluminum oxide represented by alumina, magnesium oxide, and zinc oxide, and examples of the metal nitride include aluminum nitride. Examples of the metal hydroxide include aluminum hydroxide. Examples of the carbon material include spheroidal graphite. Examples of the oxide, the nitride, and the carbide other than the metal oxide, the metal nitride, and the metal carbide include quartz, boron nitride, and silicon carbide.

Among these described above, the non-anisotropic filler 14 is preferably selected from the group consisting of alumina, aluminum, zinc oxide, boron nitride, and aluminum nitride, and alumina in particular is preferable from the viewpoint of filling properties and thermal conductivity.

As the non-anisotropic filler 14, those described above may be used singly, or two or more of those described above may be used together.

The average particle diameter of the non-anisotropic filler 14 is preferably 0.1 to 50 μm, and more preferably 0.5 to 35 μm. The average particle diameter is particularly preferably 1 to 15 μm. By setting the average particle diameter to 50 μm or less, a defect such as disturbing the orientation of the anisotropic filler 13, or the like is made unlikely to occur. By setting the average particle diameter to 0.1 μm or more, the specific surface area of the non-anisotropic filler 14 is not made larger than needed, making the viscosity of the mixed composition unlikely to increase even when a large amount is blended and making it easy to highly fill the non-anisotropic filler 14.

With respect to the non-anisotropic filler 14, for example, at least two non-anisotropic fillers 14 each having a different average particle diameter may be used as the non-anisotropic filler 14.

The average particle diameter of the non-anisotropic filler 14 can be measured by observation with an electron microscope or the like. More specifically, the particle diameters of arbitrary 50 non-anisotropic fillers are measured using, for example, an electron microscope or an optical microscope, and the average value (arithmetical mean value) can be adopted as the average particle diameter.

The content of the non-anisotropic filler 14 is preferably in a range of 200 to 800 parts by mass, and more preferably in a range of 300 to 700 parts by mass based on 100 parts by mass of the polymer matrix.

The content of the non-anisotropic filler 14, when expressed by a filling ratio on a volume basis (volume filling ratio), is preferably 30 to 60% by volume, and more preferably 40 to 55% by volume based on the total amount of the thermally conductive sheet.

By setting the content of the non-anisotropic filler 14 to 200 parts by mass or more, the amount of the non-anisotropic filler 14 interposed in the space between the anisotropic filler 13 is made sufficient, making the thermal conductive properties good. On the other hand, by setting the content to 800 parts by mass or less, an effect of enhancing the thermal conductive properties corresponding to the content can be obtained, and the heat conduction due to the anisotropic filler 13 is not inhibited by the non-anisotropic filler 14. Further, by setting the content within the range of 300 to 700 parts by mass, the thermal conductive properties of the thermally conductive sheet 10 are made excellent and the viscosity of the mixed composition is made suitable.

The ratio of the volume filling ratio of the non-anisotropic filler 13 to the volume filling ratio of the anisotropic filler 14 is preferably 2 to 5, and more preferably 2 to 3. By setting the range of the proportion of the volume filling ratios to the above-described range, the non-anisotropic filler 14 is filled moderately between the anisotropic fillers 13, so that efficient heat transfer paths can be formed, and therefore the thermal conductive properties of the thermally conductive sheet 10 can be improved.

<Thermally Conductive Sheet>

The thermal conductivity in the thickness direction of the thermally conductive sheet 10 is, for example, set to 5 W/m·K or more, preferably 10 W/m·K or more, more preferably 15 W/m·K or more, and still more preferably 18 W/m·K or more. By setting the thermal conductivity in the thickness direction to these lower limit values or more, the thermal conductive properties in the thickness direction of the thermally conductive sheet 10 can be made excellent. The upper limit is not particularly set, the thermal conductivity in the thickness direction of the thermally conductive sheet 10 is, for example, 50 W/m·K or less. The thermal conductivity is measured by a method in accordance with ASTM D5470-06.

The anisotropic filler 13 is exposed on the surfaces 10A, 10B as described above, thereby making each of the surfaces 10A, 10B of the thermally conductive sheet 10 a non-pressure-sensitive adhesive surface. The anisotropic filler 13 is disposed in such a way as to fall down on the surfaces 10A, 10B as described above, thereby making the exposed area of the anisotropic filler 13 large, so that the non-adhesiveness is enhanced.

Each of the surfaces 10A, 10B which is a non-pressure-sensitive adhesive surface is unlikely to adhere when it is touched by a hand of a worker, and is easily peeled when it adheres by pressure to an object of contact, such as a heat-generating element or a heat-dissipating element which will be mentioned later, or the like. Since each of the surfaces 10A, 10B is non-adhesive, the thermally conductive sheet 10 can be slid when it is mounted on an electronic device or the like.

At least one of the surfaces 10A, 10B of the thermally conductive sheet 10 has a surface roughness Ra of, for example, 23 µm or less, more preferably 20 µm or less, and still more preferably 10 µm or less. By setting the surface roughness Ra to 20 µm or less, the efficiency of contact with an object of contact, such as a heat-generating element or a heat-dissipating element which will be mentioned later, is made good, making it easy to improve the thermal conductive properties of the sheet. The thermally conductive sheet 10 has still more preferably a surface roughness Ra of each of the surfaces 10A, 10B within the above-described range.

The surface roughness Ra represents the arithmetical mean height Ra which is specified in JIS B0601.

The thickness of the thermally conductive sheet is considered to be used in a range of 0.1 to 5 mm, but does not need to be limited to the thickness range. The thickness of the thermally conductive sheet is appropriately changed according to the shape and intended use of an electronic device on which the thermally conductive sheet is loaded.

The thermally conductive sheet 10 is used inside an electronic device or the like. Specifically, the thermally conductive sheet 10 is interposed between a heat-generating element and a heat-dissipating element, transfers heat generated at the heat-generating element to a heat-dissipating element by heat conduction, and dissipates heat from the heat-dissipating element. Examples of the heat-generating element herein include various electronic parts, such as CPU, a power amplifier, and a power source, which are used inside an electronic device. Examples of the heat-dissipating element include a heat sink, a heat pump, and a metal housing of an electronic device. The thermally conductive sheet 10 is used in such a way that the surfaces 10A, 10B closely adhere to a heat-generating element and a heat-dissipating element, respectively and the thermally conductive sheet is compressed.

<Method for Producing Thermally Conductive Sheet>

The thermally conductive sheet of the present embodiment can be produced by, for example, a method comprising the following steps (A), (B) and (C) although the method is not particularly limited thereto.

Step (A): a step of obtaining an oriented molding such that an anisotropic filler is oriented along a direction to be a thickness direction in the thermally conductive sheet Step (B): a step of cutting the oriented molding into a sheet-like form to obtain a sheet-like molding Step (C): a step of polishing a surface of the sheet-like molding Hereinafter, each step will be described in more detail.

[Step (A)]

In the step (A), an oriented molding is molded from a mixed composition comprising: an anisotropic filler; a non-anisotropic filler; and a polymer composition to be a raw material for a polymer matrix. The mixed composition is preferably cured into an oriented molding. More specifically, the oriented molding can be obtained by a production method by magnetic field orientation or a production method by flow orientation, but among these, the production method by magnetic field orientation is preferable.

(Production Method by Magnetic Field Orientation)

In the production method by magnetic field orientation, the mixed composition comprising: a polymer composition in a liquid form to be a polymer matrix after curing; an anisotropic filler; and a non-anisotropic filler is injected inside a die or the like and is then placed in a magnetic field to orient the anisotropic filler along the magnetic field, and the polymer composition is thereafter cured, thereby obtaining an oriented molding. The oriented molding is preferably molded into a block-like form.

A release film may be disposed at a portion which is to be in contact with the mixed composition inside the die. As the release film, for example, a resin film having good releasability, or a resin film such that one surface is release-treated with a release agent or the like is used. Using a release film makes it easy to release the oriented molding from the die.

The viscosity of the mixed composition which is used in the production method by magnetic field orientation is preferably 10 to 300 Pa·s in order to subject the anisotropic filler to magnetic field orientation. By setting the viscosity to 10 Pa·s or more, the anisotropic filler and the non-anisotropic filler are made unlikely to settle. By setting the viscosity to 300 Pa·s or less, the fluidity is made good, the anisotropic filler is oriented properly in the magnetic field, and a defect such as taking too much time for orientation does not occur. The viscosity refers to viscosity measured using a rotational viscometer (Brookfield viscometer DV-E, Spindle SC4-14) at a rotational speed of 10 rpm at 25° C.

However, when an anisotropic filler and a non-anisotropic filler which are unlikely to settle are used, or an additive, such as an anti-settling agent, is combined, the viscosity of the mixed composition may be set to less than 10 Pa·s.

Examples of a source for generating lines of magnetic force, the source for applying the lines of magnetic force, in the production method by magnetic field orientation include a superconducting magnet, a permanent magnet, and an electromagnet, and a superconducting magnet is preferable from the viewpoint that a magnetic field with a high magnetic flux density can be generated. The magnetic flux density of the magnetic field which is generated from these sources for generating lines of magnetic force is preferably 1 to 30 tesla. Setting the magnetic flux density to 1 tesla or more enables the above-described anisotropic filler comprising a carbon material and the like to be oriented easily. Setting the magnetic flux density to 30 tesla or less enables practical production.

Curing of the polymer composition may be conducted by heating, and may be conducted at a temperature of, for example, about 50 to about 150° C. The heating time is, for example, about 10 minutes to about 3 hours.

(Production Method by Flow Orientation)

In the production method by flow orientation, shear force may be applied to the mixed composition to produce a preliminary sheet such that the anisotropic filler is oriented in the plane direction, a plurality of the preliminary sheets may be laminated to produce a laminated block, and the laminated block may be used as the oriented molding.

More specifically, in the production method by flow orientation, an anisotropic filler, a non-anisotropic filler, and if necessary, various additives are first mixed with the polymer composition to stir a resultant mixture, thereby preparing a mixed composition in which mixed solid substances are uniformly dispersed. The polymer compound which is used for the polymer composition may be a polymer compound comprising a polymer compound in a liquid form at normal temperature (23° C.) or may be a polymer compound comprising a polymer compound in a solid form at normal temperature. Further, the polymer composition may comprise a plasticizer.

The mixed composition has a relatively high viscosity such that shear force is applied when the mixed composition is stretched into a sheet-like form, and specifically, the viscosity of the mixed composition is preferably 3 to 50 Pa·s. A solvent is preferably blended in the mixed composition in order to obtain the viscosity.

Next, the mixed composition is molded into a sheet-like form (preliminary sheet) by stretching flatly while shear force is given to the mixed composition. By applying the shear force, the anisotropic filler can be oriented in the shear direction. With respect to means for molding the sheet, a base film may be coated with the mixed composition, for example, with an applicator for application, such as a bar coater or a doctor blade, or by extrusion molding or ejection from a nozzle, and thereafter, drying may be conducted or the mixed composition may be semi-cured as necessary. The thickness of the preliminary sheet is preferably set to about 50 to about 250 μm. In the preliminary sheet, the anisotropic filler is oriented in a direction along the plane direction of the sheet.

Subsequently, a plurality of the preliminary sheets may be stacked and laminated in such a way that the orientation directions are the same, and thereafter the preliminary sheets may be allowed to adhere to one another with a heat press or the like while the mixed composition is cured as necessary by heating, irradiation with an ultraviolet ray, or the like to form a laminated block, and the laminated block may be used as the oriented molding.

[Step (B)]

In the step (B), the oriented molding obtained in the step (A) is cut by slicing or the like perpendicularly to a direction of the orientation of the anisotropic filler, thereby obtaining a sheet-like molding. The slicing may be conducted with, for example, a shearing blade. In the sheet-like molding, an edge of the anisotropic filler is exposed from the polymer matrix on each surface which is a section by cutting, such as slicing. Further, at least part of the exposed anisotropic filler protrudes from each surface. Almost all the exposed anisotropic fillers are oriented in the thickness direction without falling down.

[Step (C)]

In the step (C), the surface of the sheet-like molding, on which the anisotropic filler has been exposed, is polished. The polishing of the surface may be conducted using, for example, sandpaper. In the present production method, by polishing the surface of the sheet-like molding, part of the exposed anisotropic filler is made to fall down. The principle is uncertain, but it is inferred that the polymer matrix is sunken during polishing due to the difference in elastic modulus between the anisotropic filler and the polymer matrix while the anisotropic filler is lifted and the lifted anisotropic filler is made to fall down in such a way as to be pressed against the surface. In the present production method, strong force needs to be applied to the anisotropic filler and the number of times of polishing needs to be made large during polishing in order to make a larger amount of the anisotropic filler fall down.

Accordingly, rough sandpaper needs to be used as the sandpaper. Examples of the rough sandpaper include sandpaper having an average grain diameter (D50) of abrasive grains of 3 to 60 μm. By using sandpaper having an average grain diameter of 3 μm or more and making the number of times of polishing large, a sufficient amount of the anisotropic filler can be made to fall down. By using sandpaper having an average grain diameter of 60 μm or less, damage to be a practical problem is prevented from occurring on the surface of the thermally conductive sheet. The sandpaper preferably has an average grain diameter (D50) of abrasive grains of 9 to 45 μm.

With respect to the number of times of polishing, for example, polishing may be conducted while the surface state is observed and the amount of the anisotropic filler 13 which falls down is checked, but the number of times of polishing is preferably made relatively large, specifically, polishing is preferably conducted in such a way that the surface roughness Ra of the surface of the thermally conductive sheet becomes 20 μm or less, and is more preferably conducted in such a way that the surface roughness becomes 10 μm or less.

In the above description, an aspect such that the anisotropic filler 13 is exposed on the surfaces 10A, 10B of the thermally conductive sheet 10, and the exposed anisotropic filler 13 is disposed in such a way as to fall down in a predetermined proportion at the surfaces 10A, 10B as described above is shown. However, in the present invention, the anisotropic filler 13 may be exposed on only one of the surfaces 10A, 10B, and the exposed anisotropic filler 13 may be disposed in such a way as to fall down in the above predetermined proportion.

Accordingly, at the other one of the surfaces 10A, 10B, the exposed anisotropic filler 13 does not have to be made to fall down, or even if the exposed anisotropic filler is made to fall down, the anisotropic filler may be made to fall down in such a way as not to reach the above predetermined proportion. In this case, the polishing according to the step (C) may be conducted only on one of the surfaces, and the polishing does not have to be conducted on the other surface, or even if the polishing is conducted, the polishing may be conducted under a condition other than the condition described in the step (C).

The other one of the surfaces 10A, 10B may be a surface such that the anisotropic filler 13 has been buried inside the polymer matrix 12. The outermost surface of the oriented molding produced by the above-described production method by magnetic field orientation is a skin layer in which the proportion of the anisotropic filler filled is lower than that of the other portions, typically in which the anisotropic filler is not contained. Accordingly, by using, for example, the outermost surface of the oriented molding as the other one of the surfaces 10A, 10B of the thermally conductive sheet 10, the other one of the surfaces 10A, 10B can be made into a surface such that the anisotropic filler 13 has been buried inside the polymer matrix 12. The surface such that the anisotropic filler 13 has been buried inside the polymer matrix 12 is a pressure-sensitive adhesive surface. The pressure-sensitive adhesive surface adheres to an object of contact, such as a heat-dissipating element or a heat-generating element, and the object of contact can thereby be fixed.

Second Embodiment

Next, a thermally conductive sheet of the second embodiment of the present invention will be described with reference to FIG. 2.

Figure 2:
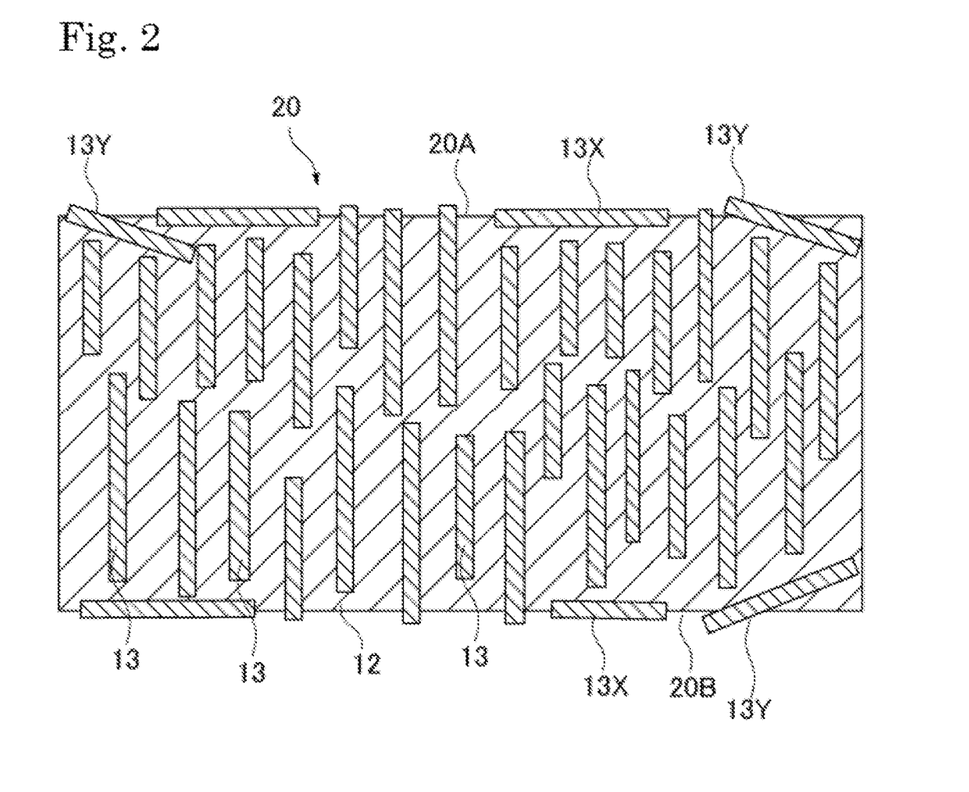
FIG. 2 is a schematic section view showing a thermally conductive sheet of the second embodiment.

In the first embodiment, the non-anisotropic filler 14 is contained as the filler in addition to the anisotropic filler 13 in the thermally conductive sheet 10, but a non-anisotropic filler is not contained in a thermally conductive sheet 20 of the present embodiment, as shown in FIG. 2. That is, in the thermally conductive sheet of the second embodiment, only a carbon fiber, for example, may be used as a filler.

The other constitution of the thermally conductive sheet 20 of the second embodiment is the same as that of the above-described thermally conductive sheet 10 of the first embodiment, except that the non-anisotropic filler is not contained, and therefore the description is omitted.

Also, in the present embodiment, the anisotropic filler 13 is exposed on at least one of the surfaces 20A, 20B of the thermally conductive sheet 20, the exposed anisotropic filler 13 is disposed in such a way as to fall down in a predetermined proportion, and the thermal conductive properties in the thickness direction can thereby be improved in the same manner as in the first embodiment.

EXAMPLES

Hereinafter, the present invention will be described with reference to Examples in more detail, but the present invention is not limited at all by these Examples.

In the present Examples, the physical properties of the thermally conductive sheets were evaluated by the following methods.

[Thermal Conductivity]

The thermal conductivity in the thickness direction of thermally conductive sheets was measured by the method in accordance with ASTM D5470-06.

[Proportion of Anisotropic Filler which is Disposed in Such a Way as to Fall Down]

An observation image was obtained by observing one surface of each thermally conductive sheet using a scanning electron microscope (trade name "SU3500", manufactured by Hitachi High-Technologies Corporation) under a condition of a magnification of 100. In the observation image, the total number of the anisotropic fillers which are exposed (A) and the number of the anisotropic fillers which are exposed and disposed in such a way as to fall down at the surface (B) in the measured region corresponding to 0.8 mm×1.2 mm of the thermally conductive sheet were counted visually by the method described in the specification, thereby calculating B/A×100. This operation was repeated 100 times in such a way that each operation was performed at a different measurement region in one surface of the thermally conductive sheet, and the average value was determined to be used as the proportion of the anisotropic filler disposed in such a way as to fall down.

[Thermal Resistance Value]

Figure 3:
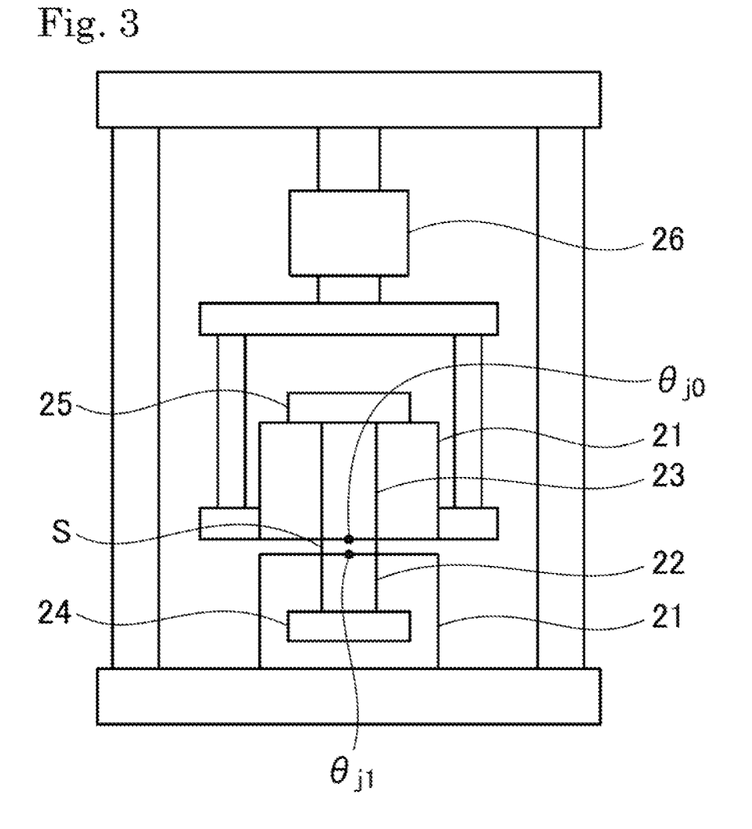
FIG. 3 is an outline diagram of a thermal resistance measuring machine.

The thermal resistance value was measured using a thermal resistance measuring machine as shown in FIG. 3 by the method described below. Specifically, a test piece S having a size of 30 mm×30 mm for the present test was prepared for each sample. Each test piece S was pasted on a copper block 22 such that a measurement face has a size of 25.4 mm×25.4 mm and side faces are covered with a thermal insulator 21, and was held between the copper block and an upper copper block 23, and load was applied with a load cell 26 to set the thickness in such a way as to become 90% of the original thickness. The lower copper block 22 is in contact with a heater 24. The upper copper block 23 is covered with the thermal insulator 21 and is connected to a heat sink 25 with a fan. Subsequently, the heater 24 was heated by a calorific value of 25 W, and 10 minutes later when the temperature would reach an almost stationary state, the temperature of the upper copper block 23 (ed, the temperature of the lower copper block 22 ($\theta_{j1}$), and the calorific value of the heater (Q) were measured to determine the thermal resistance value of each sample from the following expression (1).

$$\text{Thermal resistance} = (\theta_{j1} - \theta_{j0})/Q \qquad \text{Expression (1)}$$

wherein $\theta_{j1}$ represents the temperature of the lower copper block 22, $\theta_{j0}$ represents the temperature of the upper copper block 23, and Q represents the calorific value.

[Surface Roughness Ra]

The arithmetical mean height Ra which is specified in JIS B0601 was determined for each surface of each thermally conductive sheet.

Example 1

A mixed composition was obtained by mixing: alkenyl group-containing organopolysiloxane and a hydrogen organopolysiloxane (100 parts by mass in total, volume filling ratio of 30% by volume) as the polymer matrix (polymer composition); 130 parts by mass (volume filling ratio of 18% by volume) of a graphitized carbon fiber (average fiber length of 100 μm, aspect ratio of 10, thermal conductivity of 500 W/m·K) as the anisotropic filler; and 250 parts by mass (volume filling ratio of 20% by volume) of an aluminum oxide powder (spherical, average particle diameter of 10 μm, aspect ratio of 1.0) and 250 parts by mass (volume filling ratio of 32% by volume) of an aluminum hydroxide powder (indefinite form, average particle diameter of 8 μm) as the non-anisotropic filler.

Subsequently, the mixed composition was injected into a die whose thickness was set in such a way as to be sufficiently larger than that of each thermally conductive sheet, a magnetic field of 8 T was applied in the thickness direction to orient the graphitized carbon fiber in the thickness direction, and the matrix was thereafter cured by heating at 80° C. for 60 minutes, thereby obtaining a block-like oriented molding.

Next, the block-like oriented molding was sliced into a sheet-like form having a thickness of 2 mm using a shearing blade, thereby obtaining a sheet-like molding such that the carbon fiber is exposed.

Subsequently, a thermally conductive sheet was obtained by polishing each surface of the sheet-like molding with rough sandpaper having an average grain diameter (D50) of abrasive grains of 9 μm until a certain amount of the carbon fiber exposed from the surface fell down. Each surface of the thermally conductive sheet was a non-pressure-sensitive adhesive surface.

Figure 4:
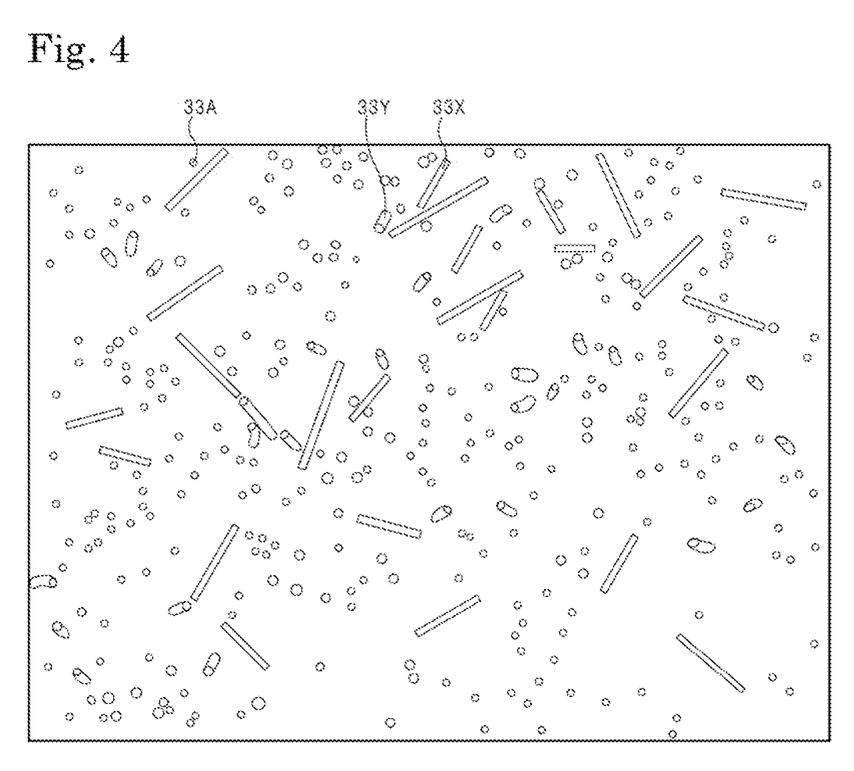
FIG. 4 is a diagram schematically showing an observation image obtained by observing a surface of a thermally conductive sheet of Example 1 with a scanning electron microscope.

FIG. 4 shows an image obtained by observing the surface of the thermally conductive sheet obtained in Example 1 with a scanning electron microscope. As shown in FIG. 4, among the carbon fibers exposed on the surface of the thermally conductive sheet, there were many carbon fibers 33A which were oriented in the thickness direction and substantially only the end surfaces of the fibers were seen, but some parts of the carbon fibers were carbon fibers 33X which were disposed in such a way as to lie down along the surface or carbon fibers 33Y which inclined with respect to the surface, and therefore were disposed in such a way as to fall down.

Examples 2 to 5

Examples 2 to 5 were each carried out in the same manner as in Example 1, except that the sandpaper used for polishing the sheet-like molding was changed to the sandpaper having an average grain diameter (D50) of abrasive grains as described in Table 1 and polishing was conducted until a certain amount of the carbon fiber fell down. Each surface of the thermally conductive sheets was a non-pressure-sensitive adhesive surface.

The surface of the thermally conductive sheet obtained in each of Examples 2 to 5 was observed with a scanning electron microscope to find that among the carbon fibers which were exposed on the surface of the thermally conductive sheet, there were many carbon fibers which were oriented in the thickness direction and were each such that substantially only the end surfaces of the fibers were seen, but some parts of the carbon fibers were carbon fibers which were disposed in such a way as to lie down along the surface or carbon fibers which inclined with respect to the surface, and therefore were disposed in such a way as to fall down, which is similar to the carbon fibers in Example 1.

Comparative Example 1

Comparative Example 1 was carried out in the same manner as in Example 1, except that the sheet-like molding was not polished. The surface of the thermally conductive sheet obtained in Comparative Example 1 was observed with a scanning electron microscope to find that almost all the carbon fibers which were exposed on the surface of the thermally conductive sheet were each oriented in the thickness direction and were each such that substantially only the end surface of the fiber can be seen and the amount of the carbon fiber disposed in such a way as to fall down was smaller than that in each Example described above.

Comparative Example 2

Comparative Example 2 was carried out in the same manner as in Example 1, except that the sandpaper used when the sheet-like molding was polished was changed to sandpaper having an average grain diameter (D50) of abrasive grains of 1 μm and polishing was conducted by the same number of times as that in Example 1.

The surface of the thermally conductive sheet obtained in Comparative Example 2 was observed with a scanning electron microscope to find that almost all the carbon fibers which were exposed on the surface of the thermally conductive sheet were each oriented in the thickness direction and were each such that substantially only the end surface of the fiber can be seen and the amount of the carbon fiber disposed in such a way as to fall down was smaller than that in each Example described above.

TABLE 1

|  |  | Example 1 | Example 2 | Example 3 | Example 4 | Example 5 | Comparative Example 1 | Comparative Example 2 |
|---|---|---|---|---|---|---|---|---|
| Polishing condition | | 9 μm | 30 μm | 60 μm | 3 μm | 6 μm | Without polishing | 1 μm |
| Anisotropic filler | Proportion of anisotropic filler which is disposed in such a way as to fall down (%) | 10.8 | 19.5 | 42.3 | 7.3 | 8.2 | 2.3 | 3.4 |
| Thermal properties | Thermal resistance °C.·in$^2$/W (when compressed by 10%) | 0.145 | 0.125 | 0.104 | 0.313 | 0.17 | 0.545 | 0.44 |
| | Thermal conductivity (W/m·K) | 19.24 | 22.32 | 25.5 | 8.91 | 16.40 | 5.12 | 6.15 |
| Surface roughness Ra | | 12 | 8.5 | 5.5 | 22.4 | 15.3 | 30.3 | 24.5 |

* Each surface had the same value with respect to the surface roughness Ra.

As is clear from the results of the Examples, when the anisotropic filler which is exposed on the surface is disposed in such a way as to fall down in a predetermined proportion in the thermally conductive sheet, a desired thermal resistance value and a desired thermal conductivity can thereby be obtained, so that the thermal conductive properties in the thickness direction can be improved. On the other hand, as shown in the Comparative Examples, when the anisotropic filler which is exposed on the surface does not fall down in a predetermined proportion, a desired thermal resistance value and a desired thermal conductivity cannot be obtained, so that the thermal conductive properties in the thickness direction cannot be improved sufficiently.

REFERENCE SIGNS LIST 10, 20 Thermally conductive sheet
10A, 10B, 20A, 20B Surface
12 Polymer matrix
13A End surface
13B Outer peripheral surface
13, 13X, 13Y Anisotropic filler
14 Non-anisotropic filler
21 Thermal insulator
22 Lower copper block
23 Upper copper block
24 Heater
25 Heat sink
26 Load cell
S Test piece
$\theta_{j0}$ Temperature of upper copper block
$\theta_{j1}$ Temperature of lower copper block

The invention claimed is:

1. A thermally conductive sheet comprising:
a polymer matrix; and
an anisotropic filler, the anisotropic filler oriented in a thickness direction, the anisotropic filler being exposed on a surface of the thermally conductive sheet, and the anisotropic filler which is exposed being disposed in such a way as to fall down in a proportion of 3.5 to 45% of a total number of the exposed anisotropic fillers.

2. The thermally conductive sheet according to claim 1, wherein the anisotropic filler is a fiber material.

3. The thermally conductive sheet according to claim 2, wherein the fiber material is a carbon fiber.

4. The thermally conductive sheet according to claim 2, wherein the fiber material has an average fiber length of 50 to 500 μm.

5. The thermally conductive sheet according to claim 1, further comprising a non-anisotropic filler.

6. The thermally conductive sheet according to claim 5, wherein the non-anisotropic filler is at least one selected from the group consisting of alumina, aluminum, zinc oxide, boron nitride, and aluminum nitride.

7. The thermally conductive sheet according to claim 5, wherein a ratio of a volume filling ratio of the non-anisotropic filler to a volume filling ratio of the anisotropic filler is 2 to 5.

8. The thermally conductive sheet according to claim 1, wherein at least part of the anisotropic filler which is disposed in such a way as to fall down at the surface is disposed in such a way as to incline with respect to the surface.

9. The thermally conductive sheet according to claim 1, wherein the polymer matrix is an addition reaction-curable silicone.

10. The thermally conductive sheet according to claim 1, wherein the thermally conductive sheet has a thickness of 0.1 to 5 mm.

11. The thermally conductive sheet according to claim 1, wherein the thermally conductive sheet has a thermal conductivity in a thickness direction of 10 w/m·K or more.

* * * * *